(12) United States Patent
Wang et al.

(10) Patent No.: US 12,106,962 B2
(45) Date of Patent: Oct. 1, 2024

(54) PATTERNING METHOD AND OVERLAY MEASUREMENT METHOD

(71) Applicant: United Microelectronics Corp., Hsinchu (TW)

(72) Inventors: Yi Jing Wang, Tainan (TW); Chia-Chang Hsu, Kaohsiung (TW); Chien-Hao Chen, Tainan (TW); Chang-Mao Wang, Tainan (TW); Chun-Chi Yu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 715 days.

(21) Appl. No.: 17/341,183

(22) Filed: Jun. 7, 2021

(65) Prior Publication Data
US 2022/0392768 A1 Dec. 8, 2022

(51) Int. Cl.
*H01L 21/033* (2006.01)
*G03F 7/00* (2006.01)
*G03F 7/20* (2006.01)
*H01L 21/311* (2006.01)
*H01L 21/66* (2006.01)
*H01L 23/544* (2006.01)

(52) U.S. Cl.
CPC ........ *H01L 21/0337* (2013.01); *G03F 7/2022* (2013.01); *G03F 7/70633* (2013.01); *H01L 21/31144* (2013.01); *H01L 22/20* (2013.01); *H01L 23/544* (2013.01)

(58) Field of Classification Search
CPC ........... H01L 21/0337; H01L 21/31144; H01L 22/20; H01L 23/544; H01L 22/12; H01L 21/0274; G03F 7/2022; G03F 7/70633; G03F 7/70466
USPC ....................................................... 430/312
See application file for complete search history.

(56) References Cited

U.S. PATENT DOCUMENTS

| | | |
|---|---|---|
| 5,472,814 A | 12/1995 | Lin |
| 6,498,105 B1 | 12/2002 | Kim |
| 6,713,231 B1 | 3/2004 | Hasegawa et al. |
| 6,839,126 B2 | 1/2005 | Yen et al. |
| 7,583,360 B2 | 9/2009 | Fritze et al. |
| 8,129,099 B2 | 3/2012 | Takemura et al. |
| 8,644,589 B2 | 2/2014 | Hsu et al. |
| 9,361,423 B2 | 6/2016 | Su et al. |
| 2007/0020565 A1* | 1/2007 | Koh .................. H01L 21/0338 430/311 |
| 2011/0207329 A1* | 8/2011 | Shih .................. H01L 21/76813 257/E21.257 |

* cited by examiner

*Primary Examiner* — Caleen O Sullivan
(74) *Attorney, Agent, or Firm* — J.C. PATENTS

(57) ABSTRACT

The embodiments of the disclosure provide a patterning method, which includes the following processes. A target layer is formed on a substrate. A hard mask layer is formed over the target layer. A first patterning process is performed on the hard mask layer by using a photomask having a first pattern with a first pitch. The photomask is shifted along a first direction by a first distance. A second patterning process is performed on the hard mask layer by using the photomask that has been shifted, so as to form a patterned hard mask. The target layer is patterned using the patterned hard mask to form a patterned target layer. The target layer has a second pattern with a second pitch less than the first pitch.

9 Claims, 10 Drawing Sheets

PATTERNING METHOD AND OVERLAY MEASUREMENT METHOD

BACKGROUND

Technical Field

The embodiments of the disclosure relate to a patterning method and an overlay measurement method, and particularly to methods for double patterning and corresponding overlay measurement.

Description of Related Art

Along with miniaturization of semiconductor devices and progress in fabrication of semiconductor device, various multi-patterning (e.g., double patterning) processes are utilized to form dense patterns with a pitch smaller than the lithographic resolution. Conventional process generally uses more than one photomask to do multi-patterning, which may increase the cost for additional photomask.

SUMMARY

The embodiments of the disclosure provide a patterning method performed by a litho-etch-litho-etch (LELE) process using a single photomask. Pitch reduction is achieved through a shift of the photomask during the second litho-etch of the LELE process.

The embodiments of the disclosure provide a method including the following processes. A target layer is formed on a substrate. A hard mask layer is formed over the target layer. A first patterning process is formed on the hard mask layer by using a photomask having a first pattern with a first pitch. The photomask is shifted along a first direction by a first distance. A second patterning process is performed on the hard mask layer by using the photomask that has been shifted, so as to form a patterned hard mask. The target layer is patterned using the patterned hard mask, so as to form a patterned target layer. The patterned target layer has a second pattern with a second pitch less than the first pitch.

In view of above, during the LELE process, the target layer is patterned to have a pitch less than the pitch of the photomask pattern through using a same photomask to perform the first and second patterning process and shifting the photomask for the second patterning process.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
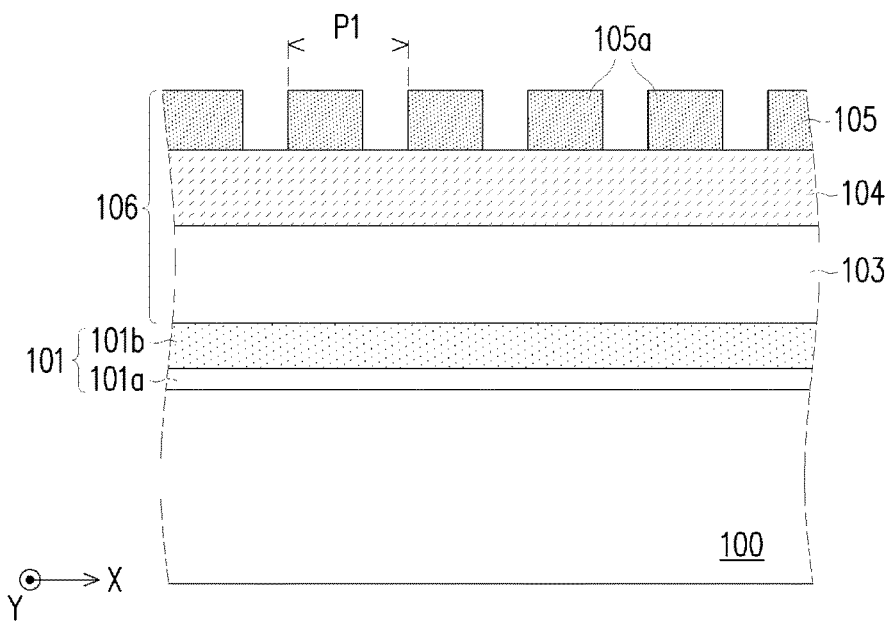
FIG. 1A to FIG. 1F are cross-sectional views illustrating a multi-patterning (e.g., double patterning) method for forming a semiconductor structure, in accordance with some embodiments of the disclosure.

The invention will be more fully described with reference to the drawings of the embodiments. However, the invention may be embodied in a variety of different forms and should not be limited to the embodiments described herein. The thickness of layers and regions in the drawings may be exaggerated for clarity. The same or similar component numbers indicate the same or similar components. Accordingly, no further description thereof is provided hereinafter.

FIG. 1A to FIG. 1F are cross-sectional views illustrating a multi-patterning (e.g., double patterning) method for forming a semiconductor structure, in accordance with some embodiments of the disclosure. The double patterning method includes performing LELE processes using a single photomask. FIG. 2A and FIG. 2B are top views illustrating a photomask and the shift of the photomask used for the patterning method, in accordance with some embodiments of the disclosure.

Figure 2A:
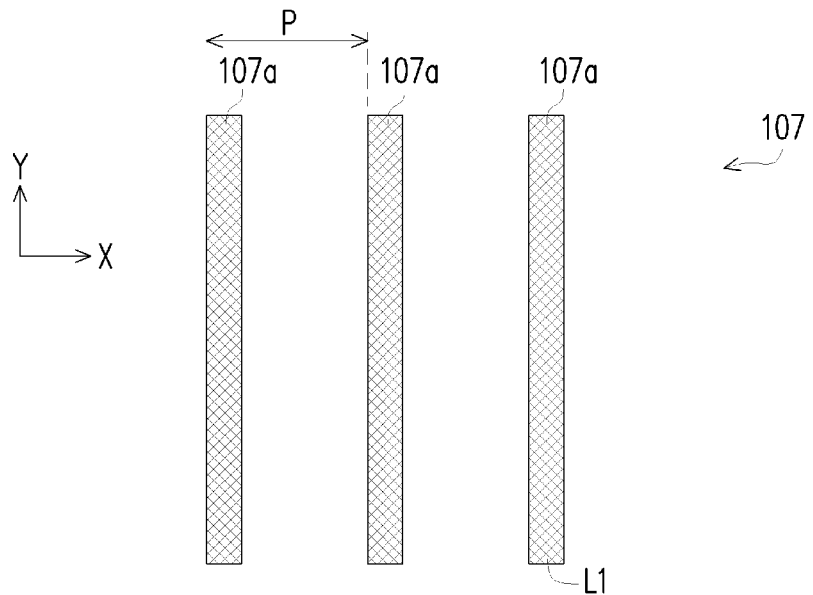
FIG. 2A and FIG. 2B are top views illustrating a photomask and the shift of the photomask used for the patterning method, in accordance with some embodiments of the disclosure.
Figure 2B:
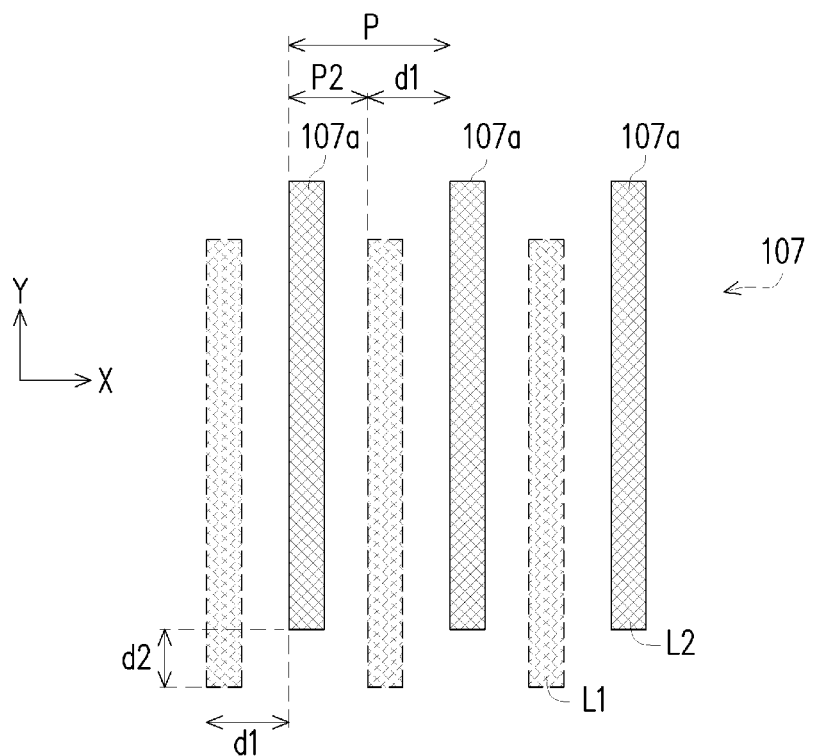

Referring to FIG. 1A, a substrate 100 is provided. The substrate 100 may be a semiconductor substrate, such as a doped silicon substrate, an undoped silicon substrate or a silicon-on-insulator (SOI) substrate. The doped silicon substrate may include a p-type dopant, an n-type dopant or a combination thereof. A target layer 101 is formed on or over the substrate 100. In some embodiments, the target layer 101 is formed to be in direct contact with the substrate 100. In alternative embodiments, additional layers (e.g., dielectric and/or conductive layer or other types of layers) may be formed between the substrate 100 and the target layer 101, such that the target layer 101 is not in direct contact with the substrate 100.

The target layer 101 may be a single-layer structure or a multi-layer structure. For example, the target layer 101 may include a first target layer 101a and a second target layer 101b disposed on the first target layer 101a. In some embodiments, each of the target layers 101 may include a dielectric material, such as oxide (e.g., silicon oxide), nitride (e.g., silicon nitride), silicon oxynitride, or combinations thereof. For example, the first target layer 101a may be a silicon nitride layer, and the second target layer 101b may be a silicon oxide layer, but the disclosure is not limited thereto. In some other embodiments, one or more of the target layers 101 may include a conductive material, a semiconductor material, or other types of materials.

Still referring to FIG. 1A, a mask layer 106 is formed on the target layer 101 through suitable deposition process, spin coating, or the like, or combinations thereof. In some embodiments, the mask layer 106 includes a hard mask layer 103, a bottom anti-reflection coating (BARC) layer 104 and a patterned photoresist 105. The hard mask layer 103 is formed on the target layer 101 and to be patterned in the subsequent processes. In some embodiments, the hard mask layer 103 may include a semiconductor material, such as amorphous silicon, but the disclosure is not limited thereto. Suitable dielectric material may also be used to form the hard mask layer 103. The BARC layer 104 may be formed on the hard mask layer 103 and underlying the patterned photoresist 105.

The formation of the patterned photoresist 105 may include forming a photoresist layer on the BARC layer 104 by a spin-coating or a deposition process, and then patterning the photoresist layer by a lithography process using a photomask 107 (FIG. 2A). The lithograph process may include the following processes. An exposure process is performed on the photoresist layer by exposing the photoresist layer to a patterned irradiation (e.g., light) through the photomask 107 (FIG. 2A). Thereafter, a development process is performed on the photoresist layer to remove the exposed portion of the photoresist layer when the photoresist layer is a positive photoresist, or remove the masked portion of the photoresist layer when the photoresist layer is a negative photoresist. As a result, the pattern of the photomask 107 (FIG. 2A) is transferred into the photoresist layer, and the patterned photoresist 105 is formed.

Referring to FIG. 1A and FIG. 2A, in some embodiments, the photomask 107 includes a pattern (or referred to as a photomask pattern) having a plurality of lines 107a extending along Y direction and arranged along X direction. In this embodiment, Y direction may also be referred to as the extending direction of the lines 107a, while X direction may also be referred to as the arrangement direction of the lines 107a. The lines 107a are disposed as side by side and spaced apart from each other to define trenches between the lines, and the illustrated photomask pattern may also be referred to as line-and-space pattern. Accordingly, the patterned photoresist 105 includes a pattern (or referred to as a photoresist pattern) having a plurality of lines 105a defining trenches therebetween. It is noted that, the pattern of the patterned photoresist 105 corresponds to the pattern of the photomask 107, and merely corresponding three lines of the pattern are shown in the photomask 107 of FIG. 2A, for the sake of brevity. It should be understood that, the numbers of the lines included in the pattern shown in FIG. 1A and FIG. 2A are merely for illustration, and the disclosure is not limited thereto.

Referring to FIG. 1A and FIG. 2A, in some embodiments, the pattern of the photomask 107 has a pitch P. Herein, the term "pitch" refers to a width of a feature (e.g., line) plus the distance from the feature to the next immediately adjacent feature. In other words, the pitch P of the photomask pattern refers to the width of the line 107a plus the space between the adjacent two lines 107a. In some embodiments, the lines 107a of the photomask have the same width, and the spaces between the lines 107a are constant and substantially the same. Accordingly, the pattern of the patterned photoresist 105 has a pitch P1 which is defined by a width of the line 105a plus the space between adjacent two lines 105a. The pitch P1 is substantially equal to the pitch P. It is noted that, although the photomask 107 and the patterned photoresist 105 are shown to include line-and-space patterns, the disclosure is not limited thereto. In some other embodiments, the photomask 107 and the patterned photoresist 105 may include other types of patterns, such as holes.

Figure 1B:
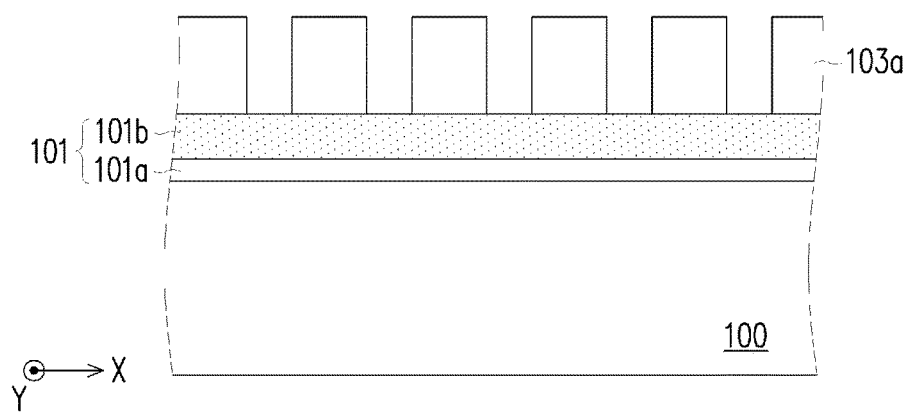

Referring to FIG. 1A to FIG. 1B, after the patterned photoresist 105 is formed, an etching process may be performed on the underlying BARC layer 104 and the hard mask layer 103 by using the patterned photoresist 105 as an etching mask, such that the pattern of the patterned photoresist 105 is transferred into the hard mask layer 103, and a patterned hard mask layer 103a is formed. In some embodiments, the patterned photoresist 105 and/or the BARC layer 104 may be consumed during the etching process. After the etching process, the patterned photoresist 105 and/or the BARC layer 104 that are remained (if any) may be removed.

Referring to FIG. 1B, the patterned hard mask layer 103a has a pattern including a plurality of lines defining trenches therebetween, which is substantially the same as that of the patterned photoresist 105 (FIG. 1A). The pattern of the patterned hard mask layer 103a has a pitch substantially equal to the pitch P1 of the patterned photoresist 105 or the pitch P of the photomask 107 (FIG. 2A).

Figure 1C:
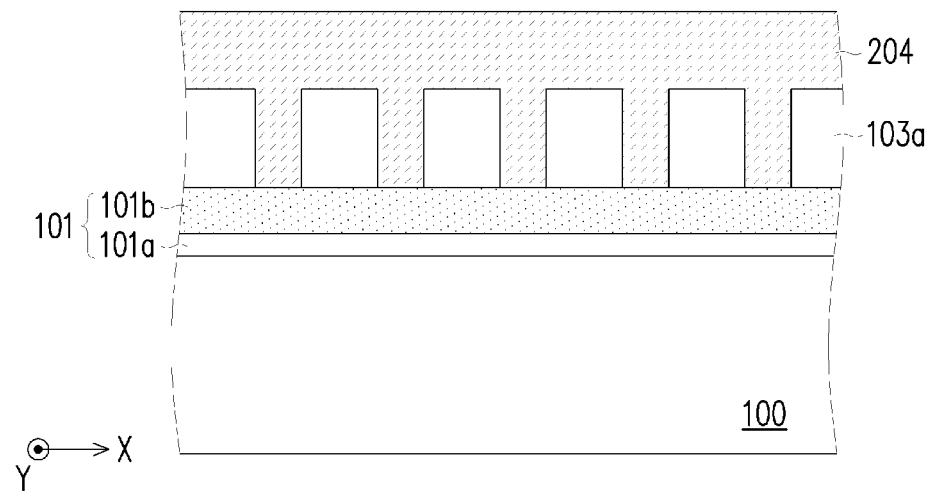

Referring to FIG. 1C, a BARC layer 204 is then formed on the patterned hard mask layer 103a to cover the top surface of the patterned hard mask layer 103a and fill into the trenches of the hard mask layer 103a. The BARC layer 204 includes a material similar to that of the BARC layer 104.

Figure 1D:
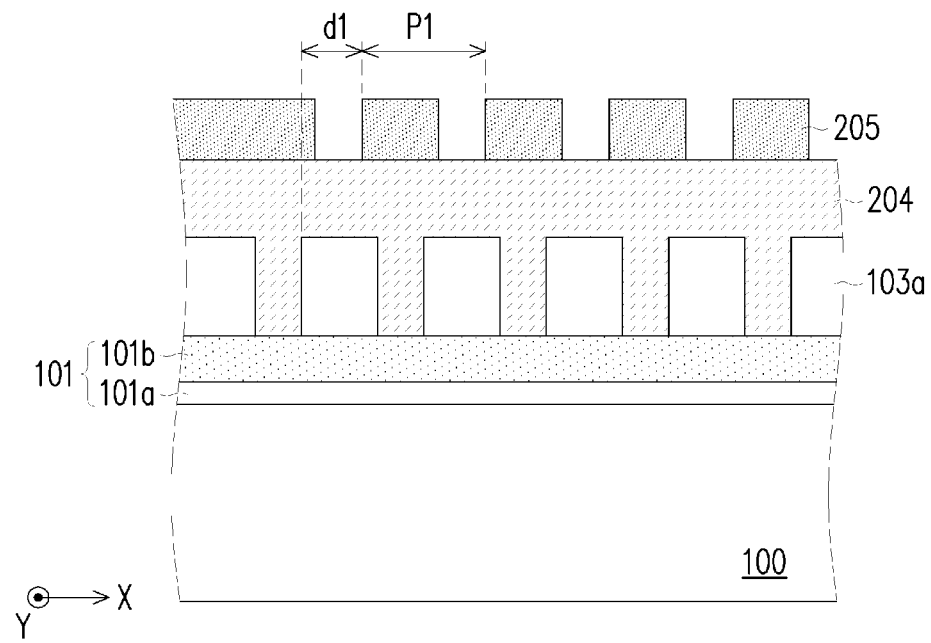

Referring to FIG. 1D, a patterned photoresist 205 is formed on the BARC layer 204. The formation of the patterned photoresist 205 may include forming a photoresist layer on the BARC layer 204 and then patterning the photoresist layer by a lithography process. In some embodiments, before performing the lithography process for forming the patterned photoresist 205, the photomask 107 is shifted by a scanner job, for example, and the lithography process is performed using the photomask 107 (FIG. 2B) that has been shifted. The lithography process includes exposing the photoresist layer to a patterned irradiation (e.g., light) through the photomask 107 (FIG. 2B) that has been shifted and then applying a development process to the photoresist layer. FIG. 2A to FIG. 2B illustrates the shift of the photomask 107 for the formation of the patterned photoresist 205, in accordance with some embodiments of the disclosure.

Referring to FIG. 2A and FIG. 2B, in some embodiments, the photomask 107 is disposed at the location L1 for the patterning of the photoresist 105 (FIG. 1A), and the photomask 107 is shifted from the location L1 to the location L2 for the patterning of the photoresist 205. It is noted that, in FIG. 2B, the photomask 107 shown in dotted line indicates the original location L1 where the photomask 107 was disposed and that the photomask 107 has been shifted from the location L1 to the location L2.

In some embodiments, the photomask 107 is shifted in both X and Y directions. It is noted that, X and Y directions respectively includes ±X directions and ±Y directions, wherein +X and +Y directions are oriented as the arrows shown in FIG. 2B, while −X and −Y directions (not shown) are opposite to the +X and +Y directions, respectively. In some embodiments, the photomask 107 may be shifted in X (e.g., +X, or alternatively −X) direction by a distance d1 and shifted in Y (e.g., +Y, or alternative −Y) direction by a distance d2. In the illustrated embodiments, the photomask 107 has a positive shift in X direction and a positive shift in Y direction, and the distances d1 and d2 may also be referred to as positive shifts +d1 and +d2 or +d1 shift and +d2 shift, respectively. However, the disclosure is not limited thereto. In some embodiments, X direction is the arrangement direction of the lines 107a, and perpendicular to the extending direction (Y direction) of the lines 107a. In some embodiments, the shift distance d1 in X direction is less than (e.g., half of) the pitch P of the photomask pattern, but the disclosure is not limited thereto.

Referring back to FIG. 1D, as a result, the patterned photoresist 205 including a pattern having the pitch P1 is formed through the photolitograph process performed using the shifted photomask 107. The pitch P1 is substantially equal to the pitch P of the photomask pattern. The pattern of the patterned photoresist 205 is shifted with respect to the pattern of the photoresist 105 (and thus the pattern of the patterned hard mask layer 103a) in X and Y directions by distances corresponding to the shift distances of the photomask 107. In some embodiments, as shown in FIG. 1D, the photoresist pattern is laterally shifted from the pattern of the patterned hard mask layer 103a in X direction by a distance d1 that is substantially equal to the shift distance d1 of the photomask 107 (FIG. 2B).

Figure 1E:
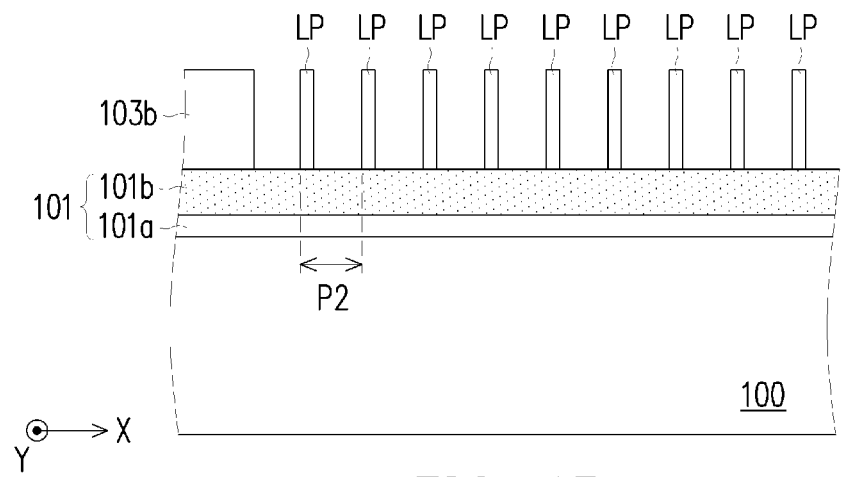

Referring to FIG. 1D and FIG. 1E, thereafter, an etching process using the patterned photoresist 205 as an etching mask is performed to transfer the pattern of the patterned photoresist 205 into the patterned mask layer 103a, so as to form a patterned hard mask 103b. The BARC layer 204 and the underlying hard mask layer 103a exposed by the patterned photoresist 205 are removed by the etching process. In some embodiments, during the etching process, the patterned photoresist 205 and/or the BARC layer 204 may be consumed. After the patterned hard mask layer 103a is etched, the patterned photoresist 205 and/or the BARC layer 204 that are remained (if any) may be removed.

Referring to FIG. 1E and FIG. 2B, in the embodiments, the patterned hard mask 103b includes a pattern corresponding to an original pattern of the photomask 107 and a pattern corresponding to the shifted pattern of the shifted photomask 107. In some embodiments, the patterned hard mask 103b has a pattern (e.g., line-and-space pattern) including a plurality of lines LP spaced from each other. The pattern has a pitch P2 which is defined by a width of the line LP plus a space between adjacent two lines LP. In the embodiments, the pitch P2 is less than the pitch P1 (FIG. 1A/FIG. 1D) or the pitch P. For example, the pitch P2 is half of the pitch P1 (or the pitch P) when the shift distance d1 in the arrangement direction (e.g., X direction) of the lines 107a is half of the pitch P.

Figure 1F:
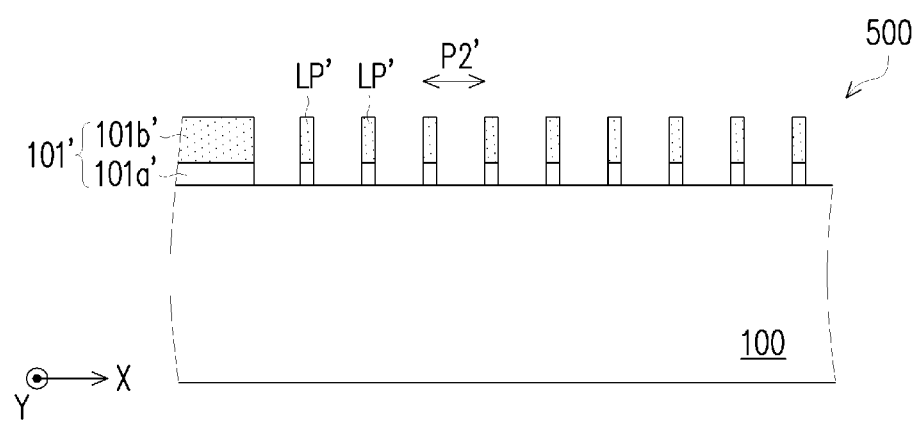

Referring to FIG. 1E and FIG. 1F, thereafter, a patterning process is performed on the target layer 101 using the patterned hard mask 103b, so as to transfer the pattern of the patterned hard mask 103b into the target layer 101. For example, an etching process is performed on the target layer 101 using the patterned hard mask 103b as an etching mask, so as to remove portions of the target layer 101 exposed by the patterned hard mask 103b, and a patterned target layer 101' is thus formed. In some embodiments, the patterned target layer 101' includes a first patterned target layer 101a' and a second patterned target layer 101b' disposed on the first patterned target layer 101a', but the disclosure is not limited thereto.

Referring to FIG. 1F, in some embodiments, the patterned target layer 101' includes a pattern (e.g., line-and-space pattern) including plurality of lines LP' having a pitch P2' which is substantially equal to the pitch P2, and is substantially half of the pitch P of the photomask 107 (FIG. 2A/2B). As such, a semiconductor structure 500 including a substrate 100 and a patterned target layer 101' disposed on the substrate 100 is thus formed.

In the embodiments of the disclosure, a litho-etch-litho-etch (LELE) process is used for the double patterning method. The patterning method uses a single photomask 107 to perform the first and second patterning of the LELE process and achieves mall pitch of the target layer by shifting the photomask by a distance (such as half of the pitch of photomask patterns) during the second patterning process.

Figure 3A:
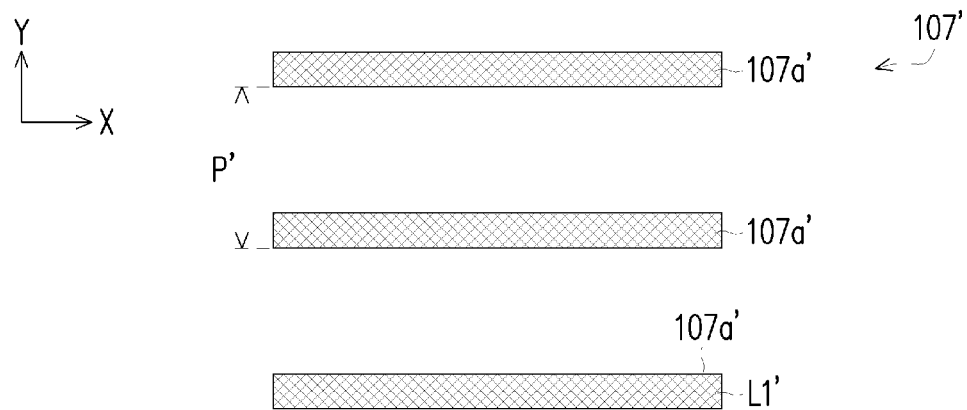
FIG. 3A and FIG. 3B are top views illustrating a photomask and the shift of the photomask used for the patterning method, in accordance with some other embodiments of the disclosure.
Figure 3B:
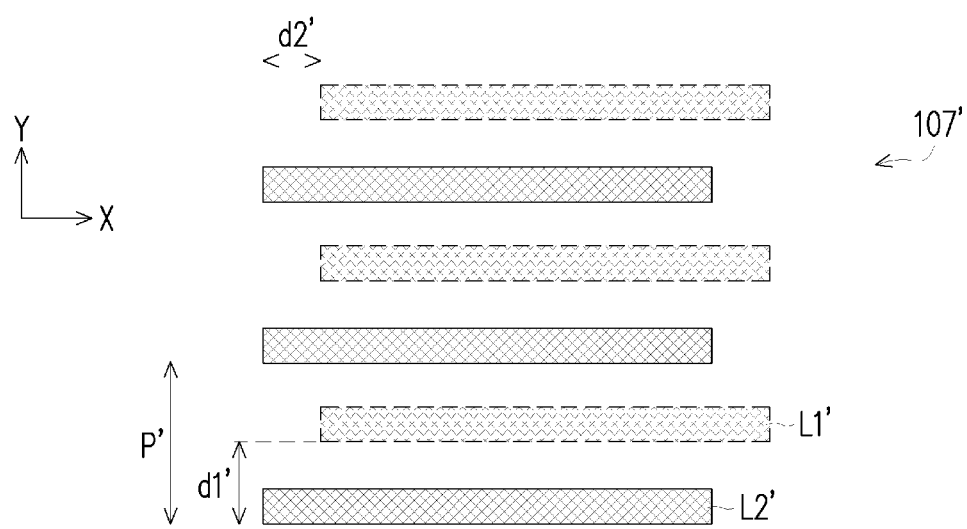

It is noted that, the pattern of the photomask 107 used for the pattering method shown in the foregoing embodiments are merely for illustration, and the disclosure is not limited thereto. In some other embodiments, as shown in FIG. 3A and FIG. 3B, a photomask 107' used for LELE process may include a pattern (e.g., line-and-space pattern) having a plurality of lines 107a' extending in X direction and arranged along Y direction. In this embodiment, X direction may also be referred to as the extending direction of the lines 107a', while Y direction may also be referred to as the arrangement direction of the lines 107a'. The lines 107a' of the photomask 107' may have a pitch P'. During the LELE process, the photomask 107' may be disposed at the location L1' for performing the first patterning (i.e., first litho-etch) process, and the photomask 107' is shifted from the location L1' to the location L2' by a scanner job, for example, for performing the second patterning (i.e., second litho-etch) process.

In some embodiments, the shift of the photomask 107' includes shifting the photomask 107' along Y direction (e.g., −Y direction, or alternatively +Y direction) by a distance d1' which may be less than (e.g., half of) the pitch P', and shifting the photomask 107' along X direction (e.g., −X direction, or alternatively +X direction) by a distance d2'. The shift of the photomask 107' along Y direction is configured for reducing the pitch of the resulted pattern of the hard mask layer or the target layer achieved from the LELE process. In some embodiments, the cross-sectional views of the semiconductor structures taken along Y direction that are formed by the LELE process using the photomask 107' is substantially the same as those shown in FIG. 1A to FIG. 1F.

Further, in the embodiments of the disclosure, the pattern of the photomask is not limited to line-and-space pattern for defining trenches, and may also include other suitable types of patterns. For example, in some other embodiments, the pattern of the photomask may be used for defining holes in target layer(s), and the pitch of the holes in the target layer may be formed to be less than (e.g., half of) the pitch of the photomask pattern by using the single photomask to do the LELE process and shifting the photomask from a first location (for the first patterning process) to a second location (for the second patterning process) by a distance, such as half of the pitch of the photomask pattern.

In the embodiments, the shift of the photomask in the arrangement direction (e.g., X or Y direction) of the photomask pattern is performed to reduce the pitch of the resulted pattern in the target layer. On the other hand, the shift of the photomask in both the X and Y directions (e.g., arrangement direction and the extending direction, or vice versa) of the photomask pattern are configured for overlay measurement, such as diffraction-based overlay (DBO) measurement.

Figure 4A:
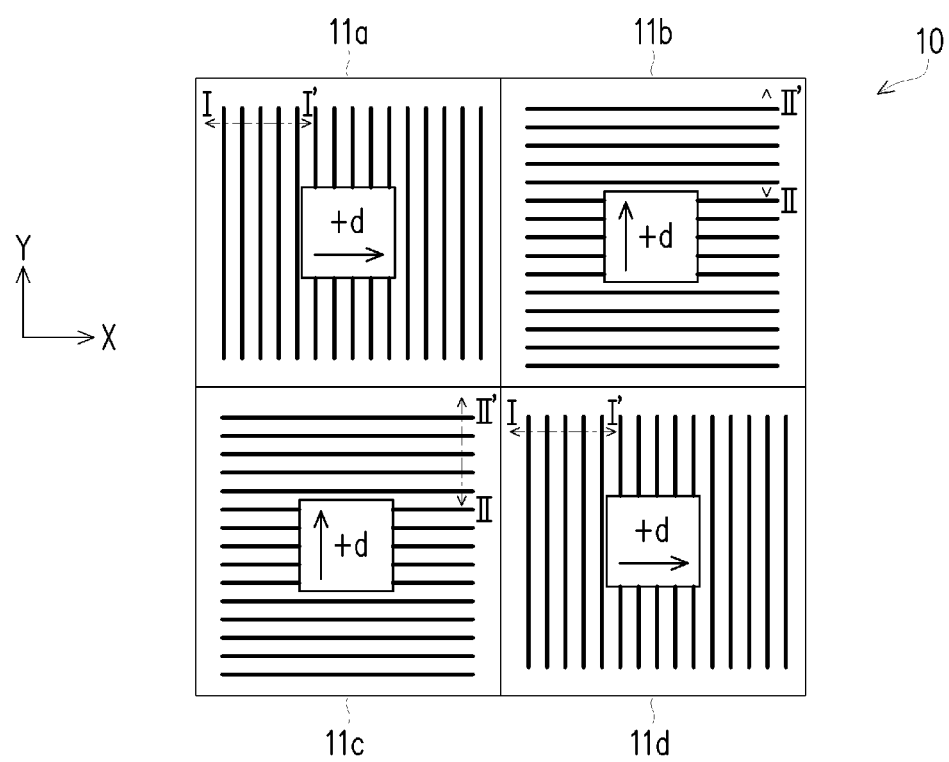
FIG. 4A illustrates a layout of an overlay measurement structure according to some embodiments of the disclosure.

FIG. 4A illustrates a layout of an overlay measurement structure (e.g., DBO measurement structure) 10 used for overlay measurement according to some embodiments of the disclosure.

The overlay measurement structure 10 is disposed in a wafer within an exposure area of the photomask 107 (i.e., the area directly underlying the photomask 107) during the patterning process, and may be formed simultaneously with the structure shown in FIG. 1D. It is noted that, for the sake of brevity, the pattern corresponding to the overlay measurement structure 10 is not shown in the illustrated photomask 107. In some embodiments, during the LELE process, both the structure shown in FIG. 1D and the overlay measurement structure 10 are disposed in a wafer within the exposure area of the photomask 107, the structure shown in FIG. 1D may be formed within a die region of the wafer, while the overlay measurement structure 10 may be formed within a periphery region (e.g., scribe region) of the wafer other than the die region. It is noted that, a plurality of overlay measurement structure 10 may be disposed in the wafer within one exposure area of the photomask. The overlay measurement structure 10 may be configured for measuring the overlay between the underlying pattern and the current pattern of the structures formed in the die region, such as the overlay between the patterned hard mask layer 103a and the patterned photoresist 205, so as to further determine and/or adjust the parameter of the scanner job for shifting the photomask.

In some embodiments, the overlay measurement structure 10 includes overlay marks 11a, 11b, 11c, and 11d disposed in four quadrant areas. For example, two of the overlay marks 11a-11d (e.g., the overlay marks 11a and 11d) are configured for the overlay measurement in X direction, while the other two of the overlay marks 11a-11d (e.g., the overlay marks 11b and 11c) are configured for the overlay measurement in Y direction. The overlay marks 11a-11d each includes a pair of patterned layers formed over the substrate 100.

Figure 4B:
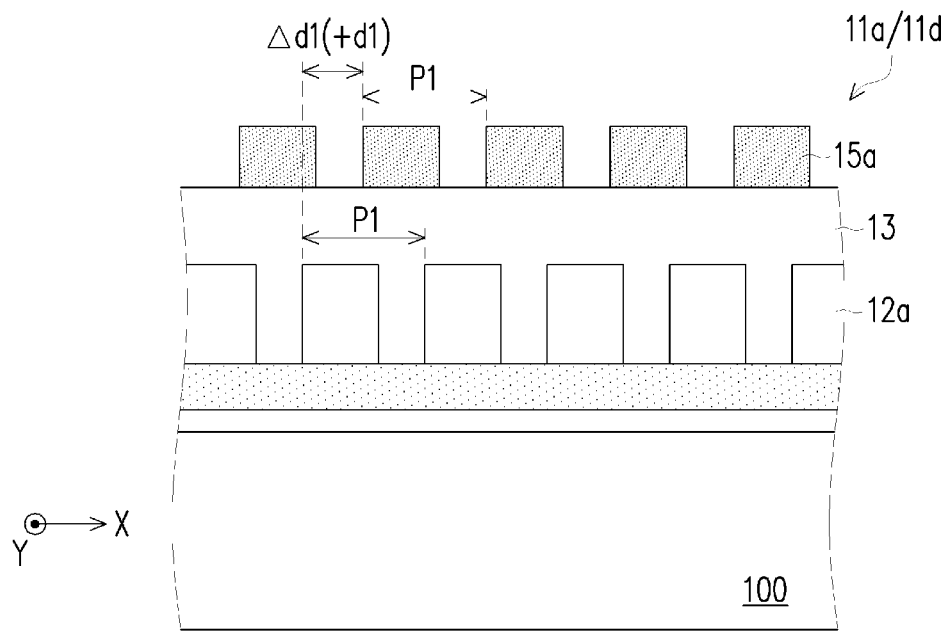
FIG. 4B illustrates a schematic cross-sectional view of the overlay measurement taken along line I-I' of FIG. 4A.
Figure 4C:
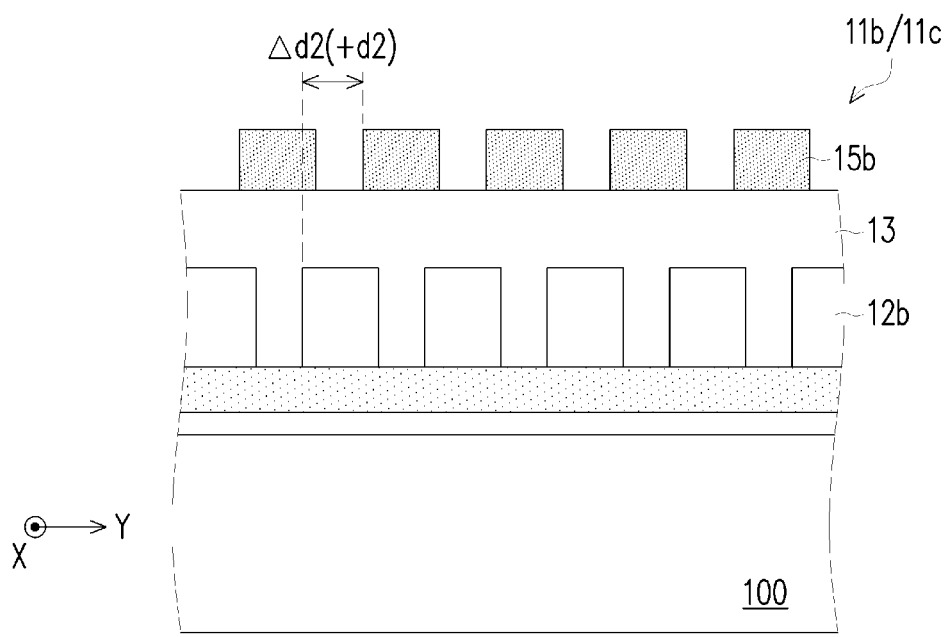
FIG. 4C illustrates a schematic cross-sectional view of the overlay measurement taken along line II-IF of FIG. 4A.

FIG. 4B illustrates a schematic cross-sectional view of the overlay marks 11a and 11b taken along line I-I' of FIG. 4A. FIG. 4C illustrates a schematic cross-sectional view of the overlay mark 11b/11c taken along line II-II' of FIG. 4B.

Referring to FIG. 4B and FIG. 4C, in some embodiments, the overlay marks 11a and 11d may each include a lower patterned layer 12a and an upper patterned layer 15a. The overlay marks 11b and 11c may each include a lower patterned layer 12b and an upper patterned layer 15b. The lower patterned layer 12a/12b may also be referred to as a previous layer and the upper patterned layer 15a/15b may also be referred to as a current layer. Each of the lower patterned layer 12a/12b and the upper patterned layer 15a/15b may include a grating pattern having line-and-space patterns. In some embodiments, the lower patterned layers 12a/12b are formed simultaneously with the patterned hard mask layer 103a (FIG. 1D), and the upper patterned layers 15a/15b are formed simultaneously with the patterned photoresist 205 (FIG. 1D). The pitch of the grating pattern of the lower patterned layer 12a/12b may be the same as the pitch of the grating pattern of the corresponding upper patterned layer 15a/15b. In the embodiments, the pitches P1 of the grating patterns may be substantially the same as the pitch P1 of the patterned photoresist 205 or the patterned hard mask layer 103a (FIG. 1D). In some embodiments, an intermediate layer 13 may be formed between the lower patterned layer 12a/12b and the upper patterned layer 15a/15b. The intermediate layer 13 may be a single-layer structure or a multi-layer structure. In some embodiments, the intermediate layer 13 include a material the same as that of the BARC layer 204 (FIG. 1D), and may be formed simultaneously with the BARC layer 204, but the disclosure is not limited thereto.

In some embodiments, the overlay mark 11a-11d may include a designed shift between the corresponding lower patterned layer 12a/12b and upper patterned layer 15a/15b. For example, in the pair of overlay mark 11a/11d configured for the overlay measurement in X direction, the upper patterned layer 15a may be laterally shifted from the lower patterned layer 12a by a shift distance Δd1 in X direction (e.g., by a positive shift +d1 in +X direction, or by a negative shift −d1 in −X direction), while in the pair of overlay mark 11b/11c configured for the overlay measurement in Y direction, the upper patterned layer 15b may be laterally shifted from the lower patterned layer 12b by a distance Δd2 in Y direction (e.g., by a positive shift +d2 in +Y direction, or by a negative shift −d2 in −Y direction).

In some embodiments, as shown in FIG. 4A to FIG. 4C, both the pair of overlay mark 11a/11d and the pair of overlay mark 11b/11c have positive shift (e.g., +d1/+d2). However, the disclosure is not limited thereto. In some other embodiments, both the pair of overlay mark 11a/11d and the pair of overlay mark 11b/11c may have negative shift (e.g., −d). In yet another embodiments, the pair of the overlay mark 11a/11d have positive shifts, while the pair of overlay mark 11b/11c have negative shifts, or vice versa.

In the embodiments of the disclosure, since a single photomask is used for the LELE process, the pair of overlay marks 11a and 11d for overlay measurement in X direction have the same shift in the same direction (+X or −X direction), for example, both have positive shift +d1 or both have negative shift −d1. Similarly, the pair of overlay marks 11b and 11c for overlay measurement in Y direction have the same shift in the same direction (+Y or −Y direction), for example, both have negative shift +d2 or both have negative shift −d2. Herein, the shift of the overlay mark refers to the lateral shift of the upper patterned layer with respect to the lower patterned layer of the overlay mark.

In some embodiments, during the overlay measurement process, a measurement light is applied to the overlay measurement structures 10, and ±first order diffraction lights ($I_{+1}$ and $L_{-1}$) are obtained.

Figure 5A:
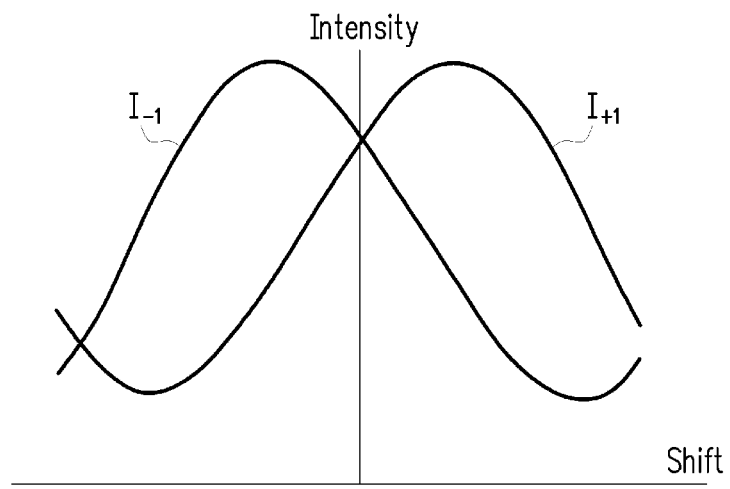
FIG. 5A schematically illustrates the light intensities of the first order diffraction lights of an overlay measurement as a function of overlay shift.
Figure 5B:
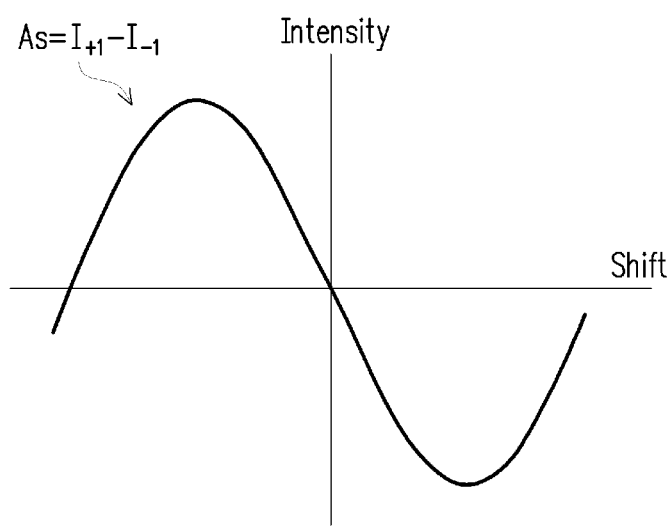
FIG. 5B illustrates the asymmetry function of the first order diffraction lights of FIG. 5A.

FIG. 5A illustrates the light intensities of the first order diffraction lights $I_{+1}$ and $L_{-1}$ as a function of overlay shift. FIG. 5B illustrates the asymmetry (As) function (As=$I_{+1}$−$L_{-1}$) of the first order diffraction lights $I_{+1}$ and $L_{-1}$.

For the overlay mark with positive shift +d, the asymmetry function is:

$$As^{+d}=k*\sin[(2\pi/\text{pitch})*(OV^{+d})]$$

While for the overlay mark with negative shift −d, the asymmetry function is:

$$As^{-d}=k*\sin[(2\pi/\text{pitch})*(OV^{-d})]$$

Herein, "OV" refers to an overlay shift between the lower patterned layer and the upper patterned layer to be measured; "pitch" refers to the pitch of the grating pattern of the overlay mark, k is unknown and may be determined by many factors such as measurement conductions and/or the materials of the layers. "d" is a known shift distance (e.g., Δd1 or Δd2). Based on the above functions, the overlay shift OV may be calculated by the following function:

$$ov = \frac{\text{pitch}}{2\pi} * \tan^{-1}\left(\tan\left(\frac{2\pi}{\text{pitch}}d\right)\left(\frac{As^{(+d)} + As^{(-d)}}{As^{(+d)} - As^{(-d)}}\right)\right)$$

Based on the overlay shift OV calculated from the data of the overlay measurement structure 10, the overlay status between the patterned photoresist 205 and the patterned hard mask layer 103a may be obtained, so as to detect whether the overlay shift between the patterned photoresist 205 and the patterned hard mask layer 103a meet the design requirement and whether the parameter of the scanner job need to be adjusted. For example, if the overlay shift calculated does not meet the design requirement, the parameter of the scanner job may be adjusted until the overlay shift meet the design requirement.

As shown in the above described function, in order to calculate the overlay shift OV (e.g., overlay shift in X/Y direction), asymmetries with positive shift +d and negative shift −d (e.g., in the corresponding X/Y direction) have to be measured.

Figure 6:
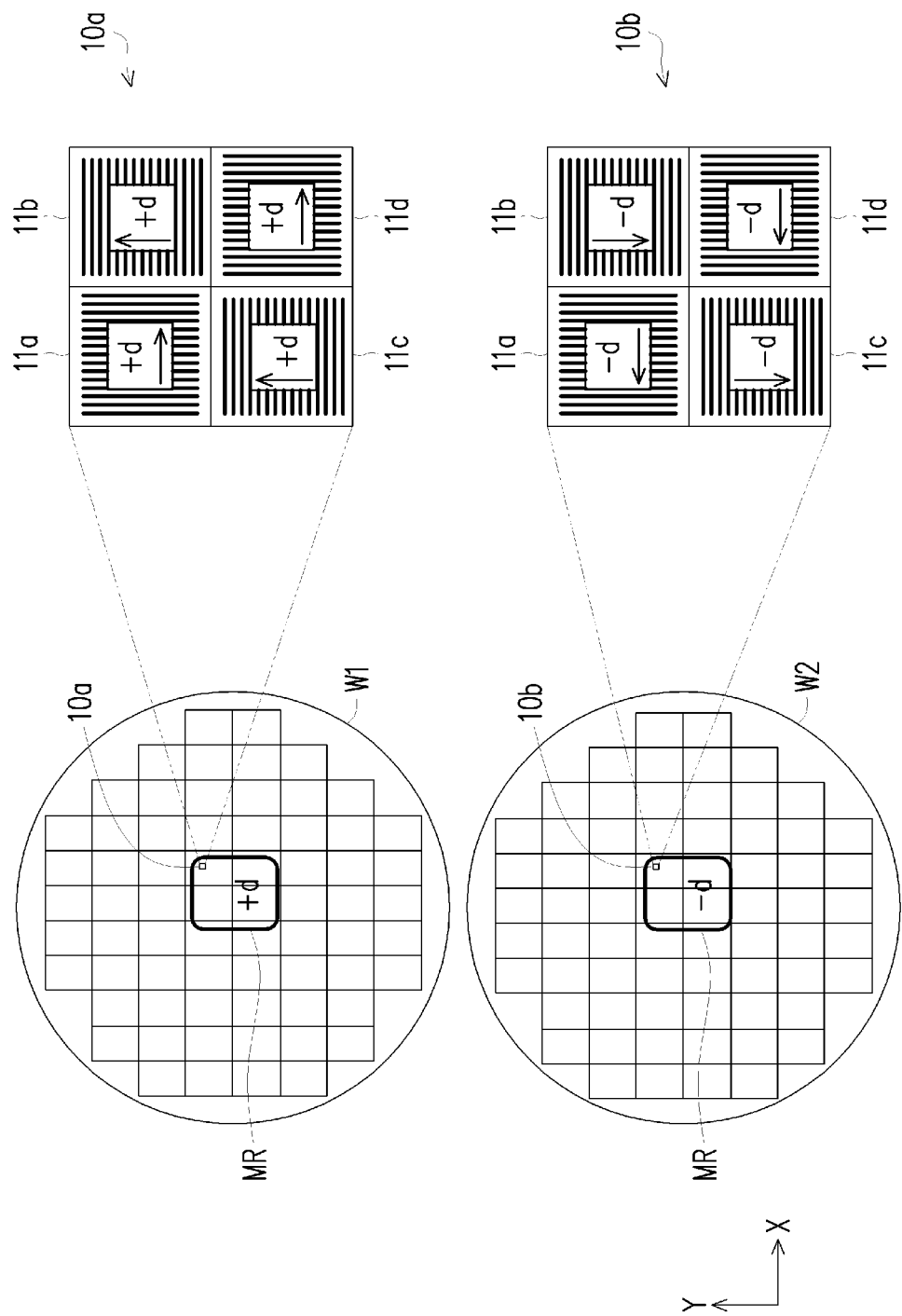
FIG. 6 and FIG. 7 are schematic views illustrating configurations for the method of the overlay measurement in accordance with some embodiments of the disclosure.
Figure 7:
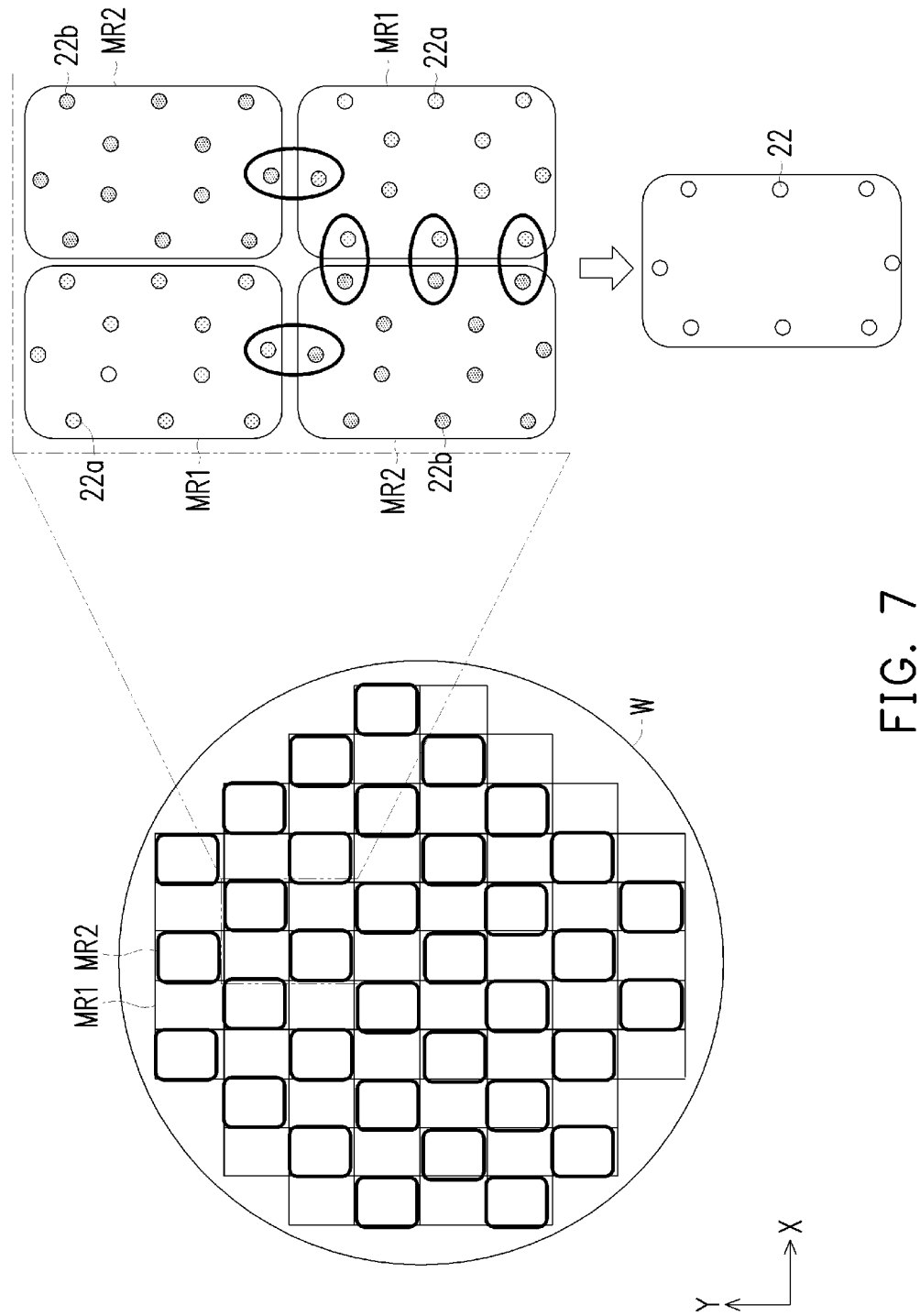

FIG. 6 and FIG. 7 are schematic views illustrating the configuration for the method of the overlay measurement in accordance with some embodiments of the disclosure.

Referring to FIG. 6, in some embodiments, two wafers are used for measuring $As^{+d}$ and $As^{-d}$. For example, a wafer W1 and a wafer W2 are provided. In some embodiments, one of the two wafers (e.g., the wafer W1) is configured to form an overlay measurement structure 10a for measuring $As^{+d}$, while the other one of the two wafers (e.g., the wafer W2) is configured to form an overlay measurement structure 10b for measuring $As^{-d}$. The overlay measurement structures 10a and 10b may be respectively formed in the wafers W1 and W2 within an exposure region MR corresponding to the photomask (e.g., the photomask 107 shown in FIG. 2A). The overlay measurement structure 10a includes an upper patterned layer having +d shift with respect to a lower patterned layer, which is achieved by using a single photomask and shifting the photomask in +X and/or +Y direction during the above described LELE process. The cross-sectional views of the overlay measurement structure 10a is substantially the same as those of the overlay measurement structure 10 shown in FIG. 4B and FIG. 4C. In other words, both the overlay marks 11a and 11d include +d shift (e.g., +d1 shown in FIG. 4B), and/or both the overlay marks 11b and 11c include +d shift (e.g., +d2 shown in FIG. 4C).

The overlay measurement structure 10b includes an upper patterned layer having −d shift with respect to a lower patterned layer, which is achieved by using a single photomask and shifting the photomask in −X and/or −Y direction during the above-described LELE process. In other words, both the overlay marks 11a and 11d include-d shift, and/or both the overlay marks 11b and 11c include −d shift. The shifting directions of the overlay marks in measurement structure 10b are opposite to those of the overlay marks in the measurement structure 10a. Through using the overlay measurement structures 10a and 10b in wafers W1 and W2, $As^{+d}$ and $As^{-d}$ can be obtained, and the corresponding overlay shift OV can be calculated through the above described function.

Referring to FIG. 7, in some other embodiments, one wafer W is used to perform the overlay measurement. For example, the wafer W includes a plurality of masking regions (or referred to as exposure regions) to be exposed to the patterned light through the photomask (e.g., the photomask 107 shown in FIG. 2A/2B) for patterning process. Each masking region includes a plurality of measurement points at which a measurement structure is disposed. In a same masking region, the overlay marks for overlay measurement in the same direction (e.g., X or Y direction) includes a same shift in a same direction, such as +d or −d shift. In some embodiments, adjacent masking regions are configured to include shifts in different directions (e.g., ±d shifts in ±X or ±Y direction). For example, the wafer W includes a plurality of masking regions MR1 and MR2. The masking regions MR1 includes a plurality of measurement points 22a having measurement structures 10b (FIG. 6) with −d shift, while the masking region MR2 includes a plurality of measurement points 22b having measurement structures 10a (FIG. 6) with +d shift, or vice versa.

In some embodiments, the masking regions MR1 and MR2 are arranged in an array including a plurality of rows and columns, and the masking regions MR1 and the masking regions MR2 may be alternatively arranged in each row and each column. In some embodiments, during the LELE process of the masking region MR1, a single photomask is used and the photomask has a −d shift (alternatively, +d shift) in the second patterning process with respect to the original location in the first patterning process, while during the LELE process of the masking region MR2, the photomask has a +d shift (alternatively, −d shift) in the second patterning process with respect to the original location in the first patterning process, which is opposite to those in the masking region MR1. In other words, the shifting direction (e.g., in horizontal and vertical direction) of the photomask in the masking region MR1 is opposite to the corresponding shifting direction (in horizontal and vertical direction) of the photomask in the masking region MR2.

In some embodiments, through measuring the asymmetric intensities of all measurement points 22a and 22b, an average $As^{(+d)}$ and $As^{(-d)}$ can be obtained to get the overlay shift between the measured layers of intra field (e.g., die region), such as the field shown in FIG. 1D. In some embodiments, adjacent two measurement points 22a and 22b (e.g., the circled measurement points 22a and 22b) are combined to get one overlay shift OV, and the overlay shift of the boundary measurement points 22 in masking region MR1/MR2 may thus be calculated through the above described function, so as to further calculate, verify and/or adjust the parameter of the scanner job that is used to perform the shift of the photomask.

In the embodiments of the disclosure, a single photomask is used to perform the LELE process, and the photomask is shifted during the second patterning process. As a result, the pitch of the pattern in the target layer is reduced and less than (e.g., half of) the pitch of the pattern of the photomask. Therefore, the cost for photomask is reduced, and the pitch of resulted pattern is reduced as well by the patterning method described herein.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method, comprising:
forming a target layer on a substrate;
forming a hard mask layer over the target layer;
performing a first patterning process on the hard mask layer by using a photomask having a first pattern with a first pitch;
shifting the photomask along a first direction by a first distance;
performing a second patterning process on the hard mask layer by using the photomask that has been shifted, so as to form a patterned hard mask; and
patterning the target layer using the patterned hard mask, so as to form a patterned target layer, wherein the patterned target layer has a second pattern with a second pitch less than the first pitch, wherein shifting the photomask further comprises:
shifting the photomask along a second direction by a second distance, wherein the second direction is perpendicular to the first direction.

2. The method of claim 1, wherein the first distance is half of the first pitch, and the second pitch is half of the first pitch.

3. The method of claim 1, wherein performing the first patterning process comprises:
forming a first photoresist on the hard mask layer;
exposing the first photoresist to a patterned irradiation through the photomask, such that the first pattern of the photomask is transferred into the first photoresist to form a first patterned photoresist; and
etching the hard mask layer using the first patterned photoresist as an etching mask, such that the first pattern is transferred into the hard mask layer.

4. The method of claim 3, further comprising:
removing the first patterned photoresist before performing the second patterning process.

5. The method of claim 3, wherein performing the second patterning process comprises:
forming a second photoresist over the hard mask layer having the first pattern;
exposing the second photoresist to a patterned irradiation through the photomask that has been shifted, such that a shifted first pattern is transferred into the second photoresist to form a second patterned photoresist; and
etching the hard mask layer using the second patterned photoresist as an etching mask, such that the shifted first pattern is transferred into the hard mask layer.

6. The method of claim 5, further comprising:
forming a first bottom anti-reflection coating (BARC) layer between the hard mask layer and the first photoresist;
removing the first BARC layer before performing the second patterning process; and
forming a second BARC layer on the hard mask layer before forming the second photoresist.

7. The method of claim 1, further comprising:
forming a first pair of overlay marks over the substrate, wherein forming each of the first pair of overlay marks comprises:
forming a lower patterned layer that is patterned using the photomask, the lower patterned layer has a lower pattern including lines extending in the first direction and arranged along the second direction; and
forming an upper patterned layer over the lower patterned layer using the photomask that has been shifted along the second direction, the upper patterned layer has an upper pattern including lines extending in the first direction and arranged along the second direction;
wherein the first pair of overlay marks both have a first shift of the upper pattern with respect to the lower pattern, and the first shift is along the second direction.

8. The method of claim 7, wherein the first pair of overlay marks are formed in a first wafer, and the method further comprising:
forming a second pair of overlay marks over an additional substrate of a second wafer, wherein forming each of the second pair of overlay marks comprises:
forming an additional lower patterned layer that is patterned using the photomask, the additional lower patterned layer has an additional lower pattern including lines extending in the first direction and arranged along the second direction; and
forming an additional upper patterned layer over the additional lower patterned layer using the photomask that has been shifted along a third direction opposite to the second direction, the additional upper patterned layer has an additional upper pattern including lines extending in the first direction and arranged along the second direction;
wherein the second pair of overlay marks both have a second shift of the additional upper pattern with respect to the additional lower pattern, and the second shift is along the third direction.

9. The method of claim 7, wherein the first pair of overlay marks are formed in a first exposure region of a wafer, and the method further comprising:
forming a second pair of overlay marks over the substrate in a second exposure region of the wafer that is adjacent to the first exposure region, wherein forming each of the second pair of overlay marks comprises:
forming an additional lower patterned layer that is patterned using the photomask, the additional lower patterned layer has an additional lower pattern including lines extending in the first direction and arranged along the second direction; and
forming an additional upper patterned layer over the additional lower patterned layer using the photomask that has been shifted along a third direction opposite to the second direction, the additional upper patterned layer has an additional upper pattern including lines extending in the first direction and arranged along the second direction;
wherein the second pair of overlay marks both have a second shift of the additional upper pattern with respect to the additional lower pattern, and the second shift is along the third direction.

* * * * *